United States Patent
Pujari

(10) Patent No.: US 10,608,129 B2
(45) Date of Patent: Mar. 31, 2020

(54) SYSTEMS AND METHODS FOR MULTI-SOURCE ENERGY HARVESTING

(71) Applicant: TOUCHLIGHT INNOVATIONS, Yorktown Heights, NY (US)

(72) Inventor: Swarnav Pujari, Yorktown Heights, NY (US)

(73) Assignee: Touchlight Innovations, Yorktown Heights, NY (US)

(*) Notice: Subject to any disclaimer, the term of this patent is extended or adjusted under 35 U.S.C. 154(b) by 0 days.

(21) Appl. No.: 16/047,697

(22) Filed: Jul. 27, 2018

(65) Prior Publication Data

US 2019/0035957 A1    Jan. 31, 2019

Related U.S. Application Data

(60) Provisional application No. 62/538,233, filed on Jul. 28, 2017.

(51) Int. Cl.
| | | |
|---|---|---|
| *H01L 31/048* | (2014.01) | |
| *H02S 30/10* | (2014.01) | |
| *H02S 40/34* | (2014.01) | |
| *H02S 20/10* | (2014.01) | |
| *F03G 7/00* | (2006.01) | |
| *H02S 10/10* | (2014.01) | |

(52) U.S. Cl.
CPC .......... *H01L 31/048* (2013.01); *F03G 7/00* (2013.01); *H02S 10/10* (2014.12); *H02S 20/10* (2014.12); *H02S 30/10* (2014.12); *H02S 40/34* (2014.12)

(58) Field of Classification Search
CPC ....... H01L 31/048; H02S 20/10; H02S 30/10; H02S 40/34; F03G 7/00
See application file for complete search history.

(56) References Cited

U.S. PATENT DOCUMENTS

| | | | |
|---|---|---|---|
| 6,856,496 B1* | 2/2005 | Mucci | H01L 31/048 136/244 |
| 8,283,794 B2 | 10/2012 | Brezet et al. | |
| 2010/0263296 A1* | 10/2010 | Jones | E04F 15/02405 52/1 |
| 2013/0068047 A1* | 3/2013 | Kemball-Cook | H02K 7/1853 74/25 |

(Continued)

FOREIGN PATENT DOCUMENTS

WO    2002/101839 A1    12/2002

OTHER PUBLICATIONS

Wanshel, Tiles That Generate Energy When People Walk Over Them Are Totally Lit, Huffington Port, (https://www.huffpost.com/entry/pavegen-tiles-generate-kinetic-energy-electricity-footsteps_n_576aba9be4b065534f487a79), pp. 1-4 (Year: 2016).*

(Continued)

*Primary Examiner* — Jayne L Mershon
(74) *Attorney, Agent, or Firm* — DLA Piper LLP (US)

(57) ABSTRACT

A power generation system is disclosed herein. The power generation system includes two or more tiles and at least one generator. Each tile of the two or more tiles is configured to house one or more solar cells. The at least one generator apparatus couples each of the two or more tiles together at a vertex of each tile. The at least one generator apparatus is configured to harvest mechanical energy as mass traverses each tile of the two or more tiles.

20 Claims, 18 Drawing Sheets

(56) References Cited

U.S. PATENT DOCUMENTS

2013/0154441 A1* 6/2013 Redmond ................ G08G 1/02
310/319

OTHER PUBLICATIONS

Wanshel et al., "Tiles That Generate Energy When People Walk Over Them Are Totally Lit", In: huffingtonpost.com, Jun. 23, 2016, https://www.huffingtonpost.com/entry/pavegen-tiles-generate-kinetic-energy-electricity-footsteps_us_576aba9be4b06553487a79, retrieved Sep. 21, 2018.
International Search Report and Written Opinion from Counterpart Application No. PCT/US2018/044121, dated Oct. 10, 2018.
International Preliminary Report on Patentability from Counterpart International Application No. PCT/US2018/044121, dated Feb. 6, 2020.

* cited by examiner

SYSTEMS AND METHODS FOR MULTI-SOURCE ENERGY HARVESTING

CROSS-REFERENCE TO RELATED APPLICATION

This application claims priority from U.S. Provisional Application Ser. No. 62/538,233, filed Jul. 28, 2017, which is hereby incorporated by reference in its entirety.

TECHNICAL FIELD

The present disclosure relates to a power generation system that includes an imbedded system that can generate electricity from ambient energy sources in different locations. More particularly, the power generation system may be suitable for urban environments.

BACKGROUND

The adoption of renewable energy has made both solar and wind power very popular. However, renewable energy sources such as solar and wind power suffer from drawbacks including a dependency on climate and weather patterns, limited useable real estate in urban environments, a prolonged return of investment time frame, and a high installation overhead and upfront capital investment.

For example, if one were interested in installing a solar panel on their roof the user would first have to determine if their roof was a suitable candidate for solar power based on the local climate and weather patterns. Then the user may make an initial monetary investment for installing the solar panel system. Moreover, installing a solar panel may alter the architectural design and structural components of a location. It may also require a prolonged period of time to recoup the cost of the initial investment. Additionally, the ability to generate power from the solar panels may be dependent on climate and weather patterns. Based on data collected from the National Renewable Energy Laboratory, if an array of solar panels were installed on a rooftop in Chicago, Ill. the power generated would save the owner $511.00 annually and pay off in 10-20 years based on the climate in Chicago over the next 2 decades.

Accordingly, there remains a need for a power generation system that does not solely depend on climate and weather patterns, does not require a prolonged return of investment time frame, and has a low installation overhead and upfront capital investment.

SUMMARY

In one embodiment, an apparatus is disclosed herein. The apparatus includes two or more tiles and at least one generator. Each tile of the two or more tiles is configured to house one or more solar cells. The at least one generator apparatus couples each of the two or more tiles together at a vertex of each tile. The at least one generator apparatus is configured to harvest mechanical energy as mass traverse over each tile of the two or more tiles.

In another embodiment, an alternative apparatus is disclosed herein. The apparatus includes a tile and three or more generator apparatuses. The tile has three or more vertices. The tile is configured to harvest solar energy. Each generator apparatus of the three or more generator is positioned at a vertex of the tile. Each generator apparatus is configured to harvest mechanical energy as mass traverses the tile.

In another embodiment, a method of harvesting multiple sources of energy is disclosed herein. The method includes providing a power generation apparatus. The power generation apparatus includes a tile having one or more solar cells included therein and a generator apparatus coupled to the tile. The method further includes harvesting solar energy by converting received light energy to electrical energy using the one or more solar cells. The method further includes harvesting mechanical energy via actuation of the generator apparatus from a relaxed state to a compressed state. The method further includes combining the solar energy and the mechanical energy into an energy reserve.

In one embodiment, a power generation system is able to generate power from multiple energy sources. In one embodiment, the multiple energy sources may be located in urban locations. For example, in one embodiment the power generation system resembles a sub-floor system that is configured to harness energy from both ambient light and any compressive motion, which may be repeated (e.g., footsteps, vehicles, water fall, rain, waves, etc.) to generate power. In some embodiments, the power generated from the harvested energy may be between about 0.1 Watts to 150 Watts or more. In some embodiments, the power generated from the harvested energy may exceed 150 Watts.

In one embodiment the power generation system includes a solar charging system and a motor. The motor speed may be controlled via a tachometer which can be created via usage of a hall effect sensor. For example, the motor may be driven using a changing magnetic field. A hall effect sensor may be implemented as a switch that allows the magnetic field to change. When the motor is coupled with a solar collector and a mechanical actuator that converts linear mechanical actuator that converts linear mechanical motion to rotational mechanical motion that amount of power generated may be pushed to a single generator.

In one embodiment, the power generation system may utilize footsteps to generate power by using a rack and pinion system or lever design. In another embodiment the power generation system may use a helical gear system along with a clutch and flywheel system. In other embodiments, fuel cells, generators, wind turbines and hydro systems may be used for powering the motor of the power generation system.

In one embodiment, the power generation system may include one or more power conversion components such as an axial or radial flux generator, a triboelectric generator, and/or a piezoelectric generator.

In one embodiment, a power generation system is able to harvest ambient energy and convert it into power at peak demand times. Excess energy may be stored for use during off-peak periods.

In one embodiment, the power generation system may be installed with little to no alteration of the architectural design of a location because the power generation system may remain recessed in the ground.

In one embodiment, the power generation system is easily deployed.

DETAILED DESCRIPTION OF THE DRAWINGS

The one or more techniques and devices disclosed herein generally relate to an apparatus and method of harvesting both solar energy and kinetic energy.

Figure 1A:
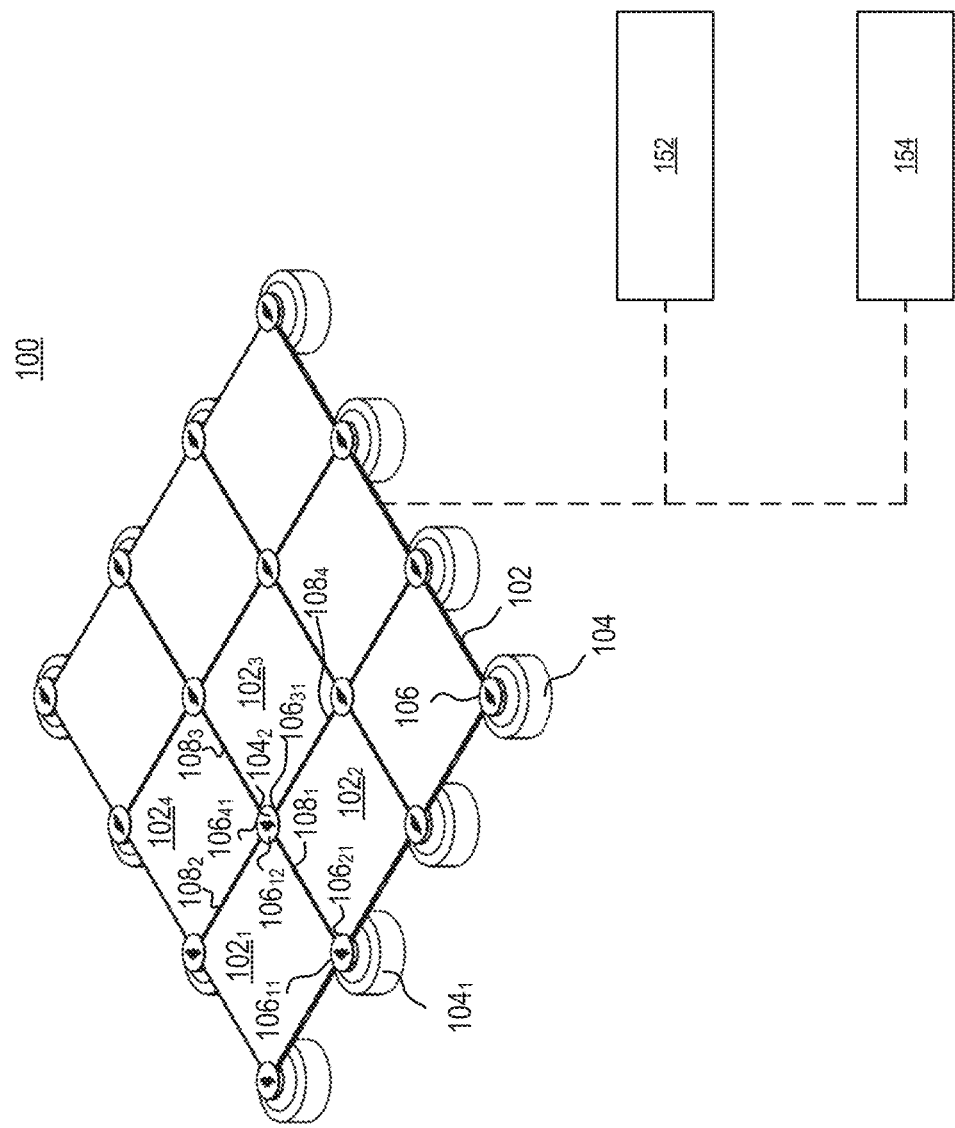
FIG. 1A is a system diagram for an exemplary embodiment of a power generation system.

FIG. 1A is a system diagram illustrating a power generation system 100, according to one exemplary embodiment. As illustrated, power generation system 100 may include one or more or more energy tiles 102 and one or more generator apparatuses 104. Each energy tile 102 may be configured to interface with at least one generator apparatus 104. Each generator apparatus 104 may join two or more energy tiles 102 together. For example, each energy tile 102 may include one or more vertices 106. Each vertex 106 may be configured to be in communication with a generator apparatus 104. As illustrated, for example, generator apparatus $104_1$ may be configured to receive a vertex $106_{11}$ from tile $102_1$ and a vertex $106_{21}$ from tile $102_2$, such that tile $102_1$ and tile $102_2$ meet an interface $108_1$. Interface $108_1$ may be substantially flush, such that any gap between tile $102_1$ and tile $102_2$ at interface $108_1$ is minimal.

Similarly, energy generator $104_2$ may be configured to be in communication tiles $102_1$-$102_4$. As illustrated, for example, generator apparatus $104_2$ may be configured to receive a vertex $106_{12}$ from tile $102_1$, a vertex $106_{22}$ from tile $102_2$, a vertex $106_{31}$ from tile $102_3$, and a vertex $106_{41}$ from tile $102_4$, such that tile $102_1$ and tile $102_4$ meet at interface $108_2$, tile $102_4$ and tile $102_3$ meet at interface $108_3$, and tile $102_3$ and tile $102_2$ meet at interface $108_4$.

Although illustrated as quadrilateral shaped, those skilled in the art may readily understand that tiles 102 may take the form of any polygon (e.g., three-sided, five-sided, n-sided, etc.).

Figure 2:
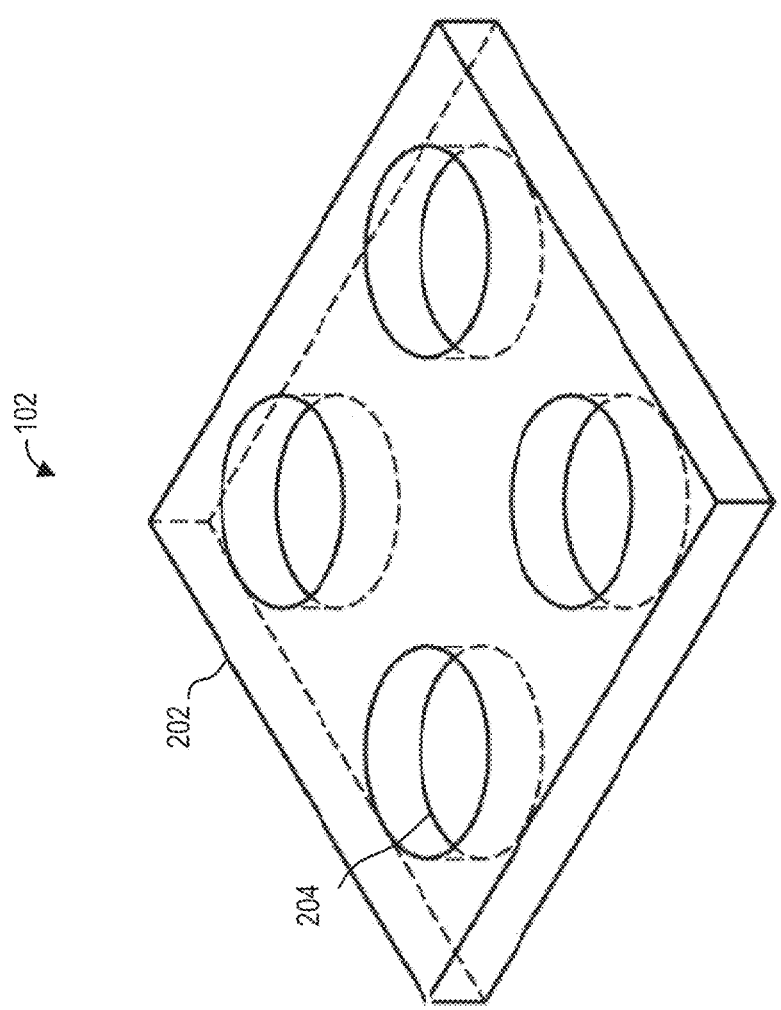
FIG. 2 is a perspective view of a component of the power generation system of FIG. 1A, according to one exemplary embodiment.

Each tile 102 may be configured to capture solar power. Tile 102 may include a back plate, a top protective surface, and one or more solar cells disposed therebetween. FIG. 2 is a perspective view of tile 102, according to one exemplary embodiment. As shown, tile 102 includes a back plate 202. One or more solar cells 204 may be positioned on top of back plate 202. As illustrated, tile 102 includes four solar cells 204. In some embodiments, back plate 202 may be formed from a metal or durable plastic/composite. Generally, back plate 202 may be formed from a material that is able to withstand impact forces and weight, as mass (e.g., individuals, shopping carts, vehicles, etc.) pass over tile 102. For example, back plate 202 may be formed from aluminum 6061, aluminum 7075, carbon fiber nylon composite, steel, stainless steel, titanium, and any other suitable material. In some embodiments, one or more solar cells 204 are positioned in parallel. In some embodiments, one or more solar cells 204 are positioned in series.

Figure 1B:
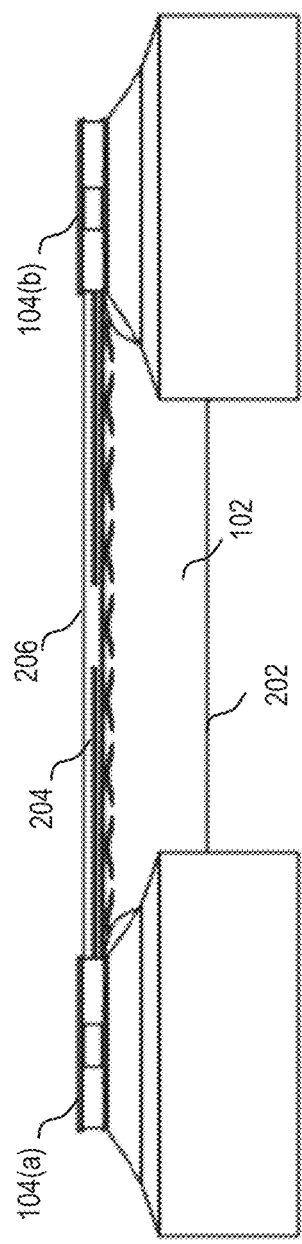
FIG. 1B is a side view of one or more components of the power generation system of FIG. 1A, according to one exemplary embodiment.

FIG. 1B is a side view of one or more components of power generation system 100, according to an exemplary embodiment. As illustrated, tile 102 is positioned between two energy generators (generator apparatus 104(a) and generator apparatus 104(b). Tile 102 includes bottom plate 202 and one or more solar cells 204 positioned thereon. For example, one or more solar cells may be partially recessed within back plate 202. Tile 202 may further include top plate 206 positioned atop bottom plate 202. Top plate 206 may be configured to protect one or more solar cells 204. Top plate 206 may be formed from a transparent or translucent material. Generally, top plate 206 may be formed of any material that allows light to pass through, and be absorbed by one or more solar cells 204. For example, top plate 206 may be formed from polycarb, acrylic, resin, aerospace grade glues, bulletproof glass, glass, and any other suitable material.

In some embodiments, top plate 206 may be formed from a resin. In this embodiment, the resin may be poured on top of pre-positioned solar cells (e.g., solar cells 204) and back plate 202. The resin may be a translucent/transparent concrete, a smooth aerospace grade high impact resin, or the like. Forming top plate 206 from such resin helps in protecting the entire enclosure (i.e., tile 102) from high impacts and, also, adds extra grip for vehicles and individuals to walk across during wet or freezing conditions.

In some embodiments, top plate 206 may be formed from a polycarbonate or acrylic material In this embodiment, during preparation of top plate 206, a protective film (not shown) may be positioned over solar cells 204 in the interim. A thin resin may be positioned between solar cells 204 and top plate 206 to improve adhesion and create a water tight seal. Tile 102 may then be sealed about an outer surface using a rubber gasket to ensure that liquid does not seep into tile 102. Further, once top plate 206 is positioned, the interim protective layer may be removed. In some embodiments, an additional layer (not shown) may be positioned on top of top plate 206. For example, the additional layer may be formed from a resin to enhance grip during wet or freezing conditions.

Referring back to FIG. 1A, each generator apparatus 104 may be configured to capture energy as a result of mass traversing tiles 102, i.e., each energy generator apparatus 104 may be configured to harvest mechanical energy. Each generator apparatus 104 may include a connector 110. Connector 110 is configured to connect two or more tiles 102. Connector 110 may be positioned to ensure an ideal amount of flex, while also maintaining a rigid body. As such, when all tiles 102 are connected via one or more connectors 110, tiles 102 may not produce any trip hazards as an individual drives or walks across tiles 102.

Figure 3:
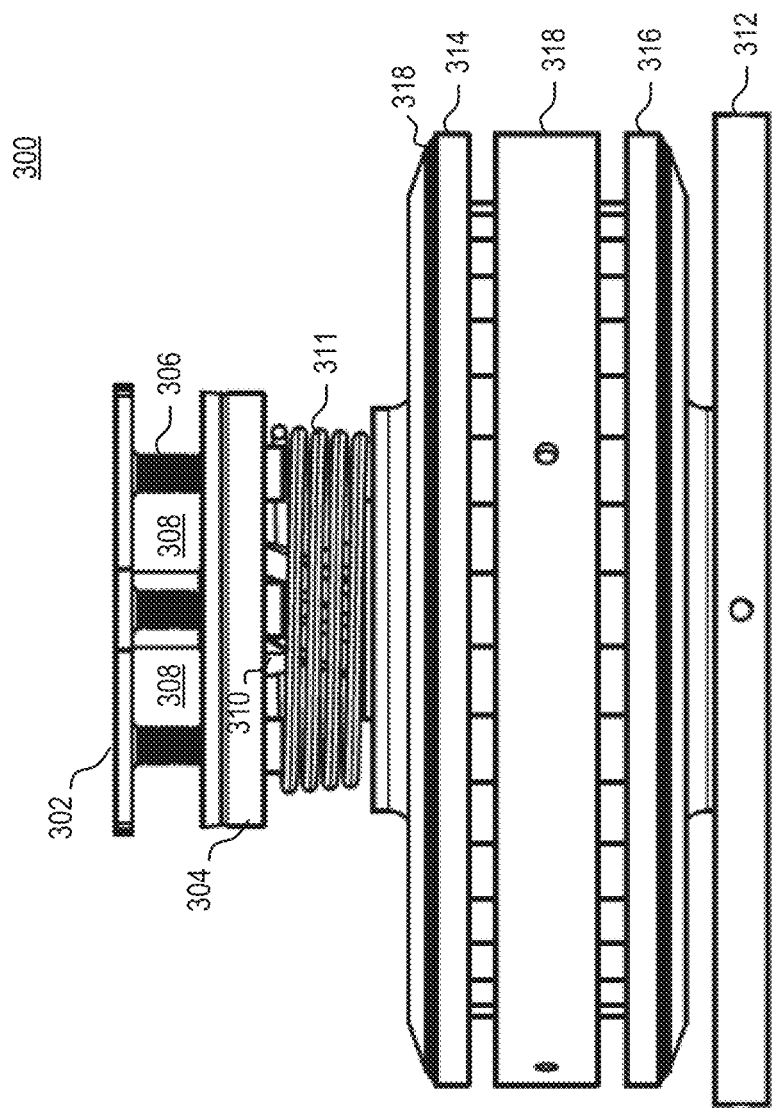
FIG. 3 is a side perspective view of a generator apparatus, according to one exemplary embodiment.

FIG. 3 is a side perspective view of a generator apparatus 300, according to one embodiment. In the embodiment discussed in FIG. 3, generator apparatus 300 is an axial flux generator. Generator apparatus 300 includes a top plate 302 and bottom plate 304. Top plate 302 may be coupled with bottom plate 304 via one or more screws 306, such that one or more openings 308 are defined therebetween. Each opening 308 may be configured to receive and support a vertex of a particular tile 102.

Generator apparatus 300 may further include a lead screw 310. Lead screw 310 may be configured to extend from top plate 302 to a lower plate 312 of generator apparatus 300. Lead screw 310 may be configured to drive one or more rotors 314 and 316. Each of rotors 314 and 316 may include an array of magnets 318. For example, each of rotors 314 and 316 may include a Halbach array or alternating polarity array of magnets. Between rotor 314 and rotor 316 may be a bearing clutch 318. In operation, downward force on tile 102 may generate a downward motion of lead screw 310 and coil 311, causing coil 311 to compress. When coil 311 returns to a relaxed state, bearing clutch 318 may be configured to maintain rotation of rotor 314 and rotor 316.

Figure 4:
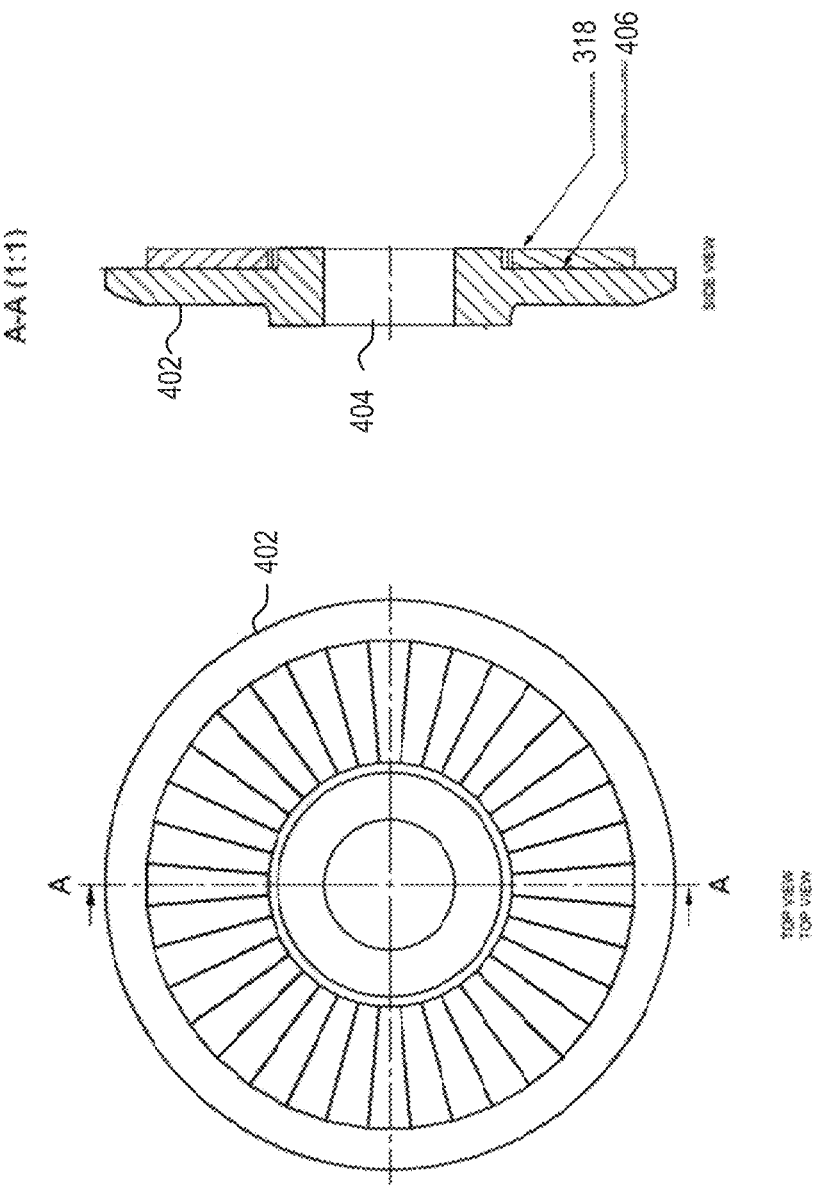
FIG. 4 illustrates one or more views of a rotor, according to one exemplary embodiment.

FIG. 4 illustrates one or more views of a rotor (e.g., rotor 314), according to one exemplary embodiment. As illustrated, rotor 314 may include a body 402 having an opening 404 formed therein. Opening 404 may be configured to receive lead screw 312. Rotor 314 may include a magnet receiving section 406. Magnet receiving section 406 may be configured to receive the array of magnets 318. Array of magnets 318 may substantially surround opening 404.

Figure 5:
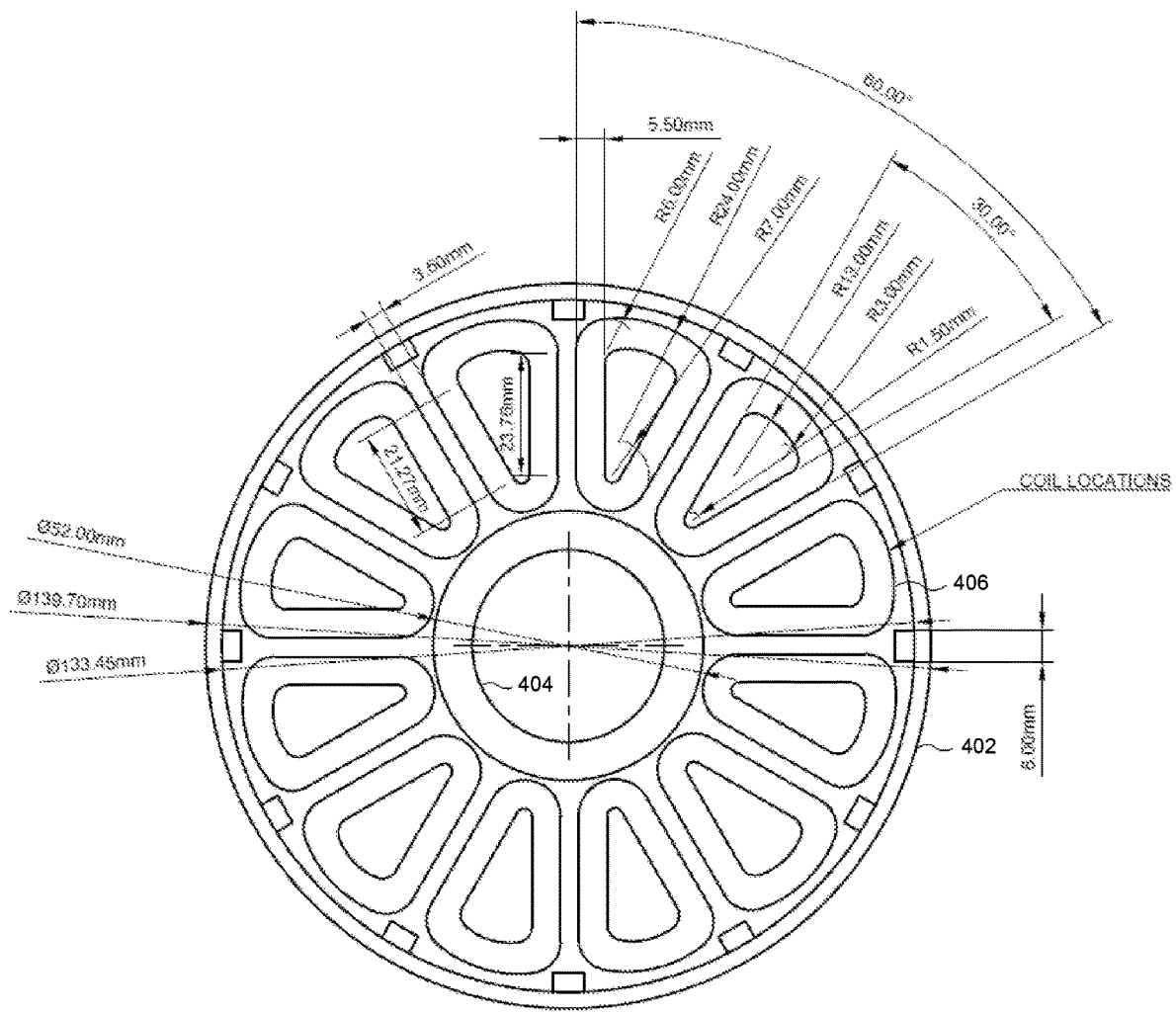
FIG. 5 is a perspective view of a stator, according to one exemplary embodiment.

Referring back to FIG. 3, in some embodiments, generator apparatus 300 may include a stator 320 may be positioned above each array of magnets 318. Stator 320 may be configured to remain stationary, as rotors 314 and 316 rotate. As such, the magnetic field created from rotors 314, 316 may cut through the one or more coils of stator 320, thereby generating electricity. FIG. 5 is a perspective view of stator 320, according to one exemplary embodiment. As shown, stator 320 includes an outer circumference 402 and an inner circumference 404. Extending from outer circumference 402 to inner circumference 404 may be one or more coils 406. In operation, the magnetic field generated by rotation of rotor 314 (or rotor 316) may induce a voltage in the one or more coils 406 of stator 320.

Figure 6:
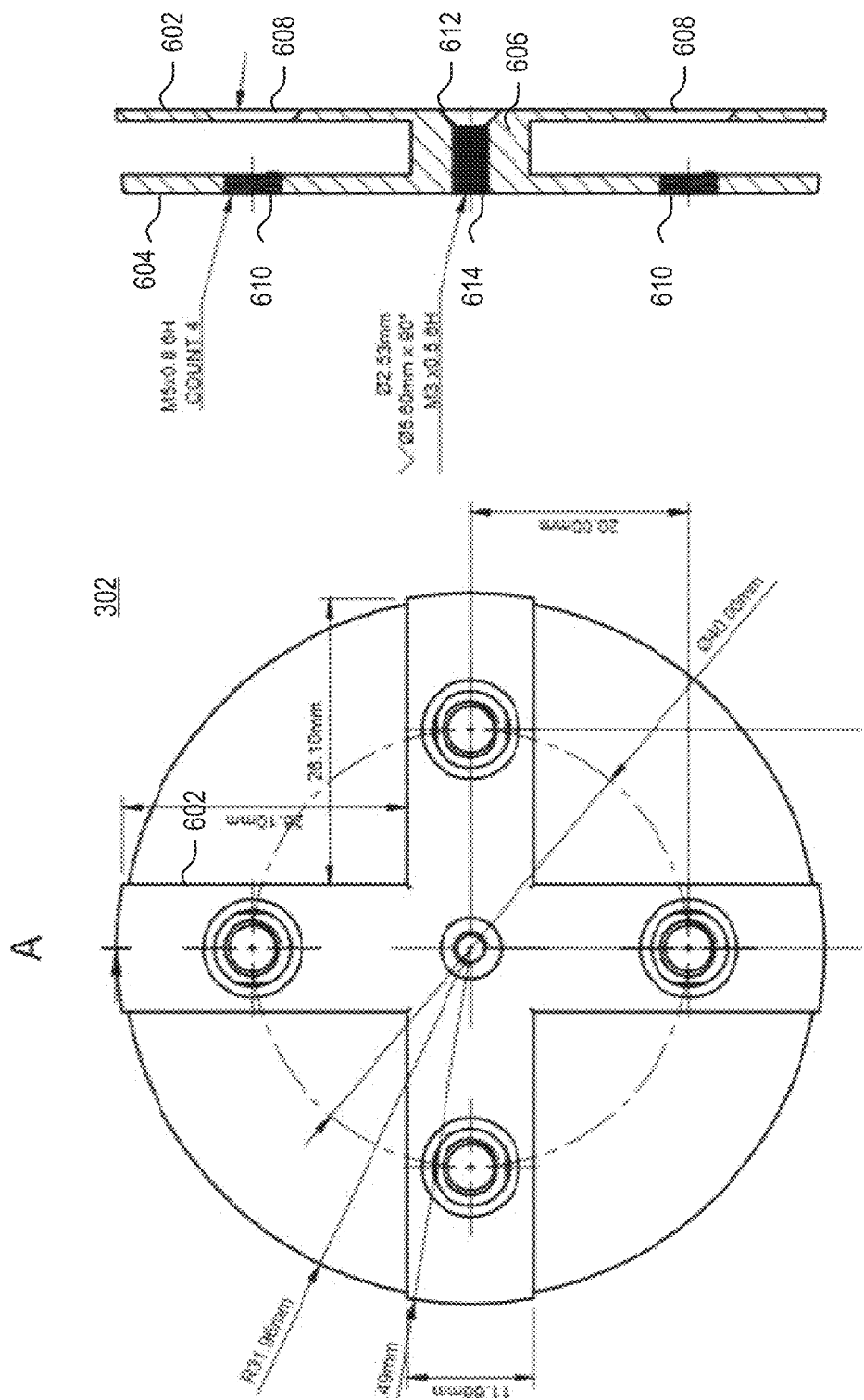
FIG. 6 is a top view of a top plate, according to one exemplary embodiment.

FIG. 6 is a top view of top plate 302, according to one exemplary embodiment. Top plate 302 may include a top portion 602, a bottom portion 604, and a middle portion 606 connection top portion 602 to bottom portion 604. Top portion 602 may include one or more openings 608. Bottom portion 604 may include one or more openings 610. Openings 608 may substantially align with openings 610. Each opening 608 and 610 may be configured to receive a screw 306. Top portion 602 may further include a central opening 612. Bottom portion 604 may further include central opening 614. Central opening 612 may substantially align with central opening 614. As such, central opening 612 and central opening 614 may be configured to receive lead screw 310.

As illustrated, top portion 602 has a diameter $d_1$, bottom portion 604 has a diameter $d_2$, and middle portion 606 has a diameter $d_3$. In some embodiments, diameter $d_1$ may be substantially equal to diameter $d_2$. Diameter $d_3$ may be smaller than diameters $d_1$ and $d_2$.

Figure 7:
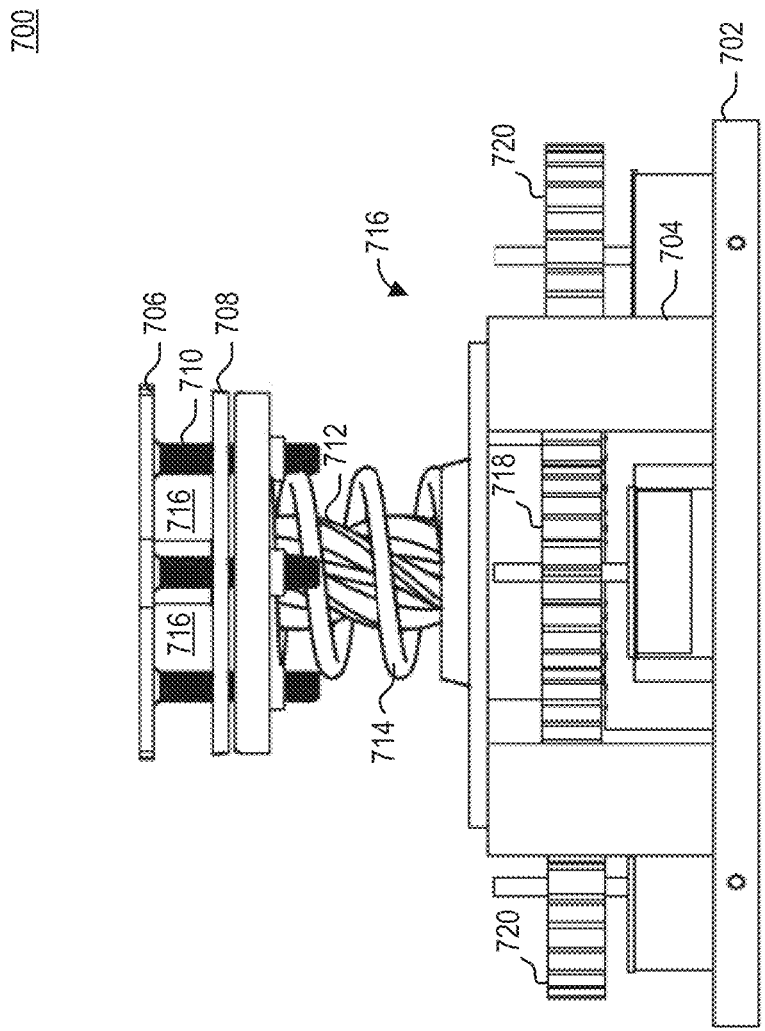
FIG. 7 is a side view of a generator apparatus, according to an exemplary embodiment.

FIG. 7 is a side view of a generator apparatus 700, according to an exemplary embodiment. Generator apparatus 700 may be a radial flux generator. Generator apparatus 700 may include a platform 702 having one or more supports 704. Platform 702 and one or more supports 704 may be configured to support and/or house one or more components of generator apparatus 700.

Generator apparatus 700 may include a top plate 706, bottom plate 708, one or more screws 710, a lead screw 712, and a biasing element 714. Top plate 706 may be coupled with bottom plate 708 via one or more screws 710. One or more openings 716 may be formed between top plate 706 and bottom plate 708. Each opening 716 may be configured to receive a vertex 106 of tile 102. Lead screw 712 may be configured to pass through top plate 706 and bottom plate 708. In some embodiments, lead screw 712 may be configured to pass through a center of top plate 706 and a center of bottom plate 708. Biasing element 714 may be positioned about lead screw 712. In some embodiments, biasing element 714 may be a spring coil.

Figure 8B:
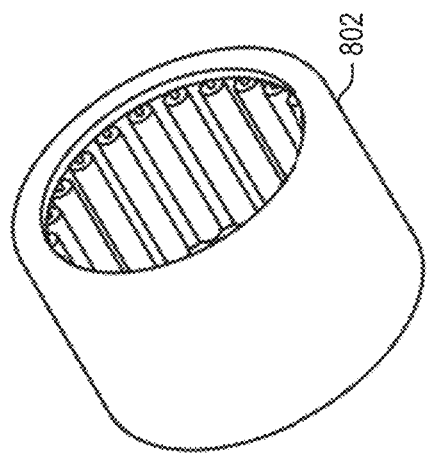
FIG. 8B is a perspective view illustrating a gear system of FIG. 7 in isolation, according to one exemplary embodiment.
Figure 8A:
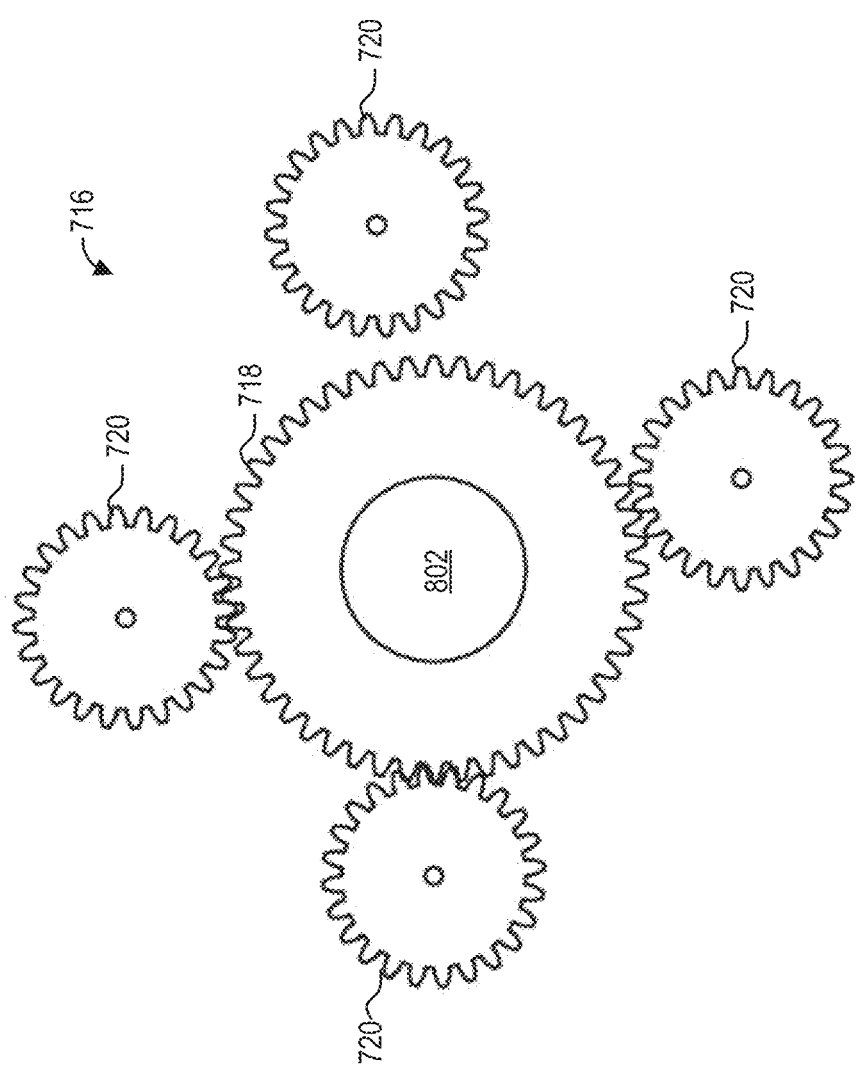
FIG. 8A is a top view illustrating a gear system of FIG. 7 in isolation, according to one exemplary embodiment.

Generator apparatus 700 may further include a gear system 716. Gear system 716 may include a central gear 718 and one or more smaller gears 720 positioned about central gear 718. FIG. 8A is a top view illustrating gear system 716 in isolation, according to one exemplary embodiment. As shown, central gear 718 may include a central opening 802. Central opening 802 may be configured to receive (or mate with) lead screw 712. In operation, upon compression of biasing element 714 and movement of lead screw 712 in a downward direction, in response to an individual traversing over a tile 102 supported by gear apparatus 700, lead screw 712 turns central gear 718, which acts like a fly wheel. FIG. 8B is a perspective view of a clutch mechanism 802, according to one exemplary embodiment. Clutch mechanism 802 may positioned adjacent central gear 718, and maintains rotation of central gear 718 once biasing element 714 and lead screw 712 return to an initial position. Rotation of central gear 718 may facilitate rotation of one or more smaller gears 720. Rotation of the smaller gears 720 may result in power generation by energy apparatus 700.

Figure 9:
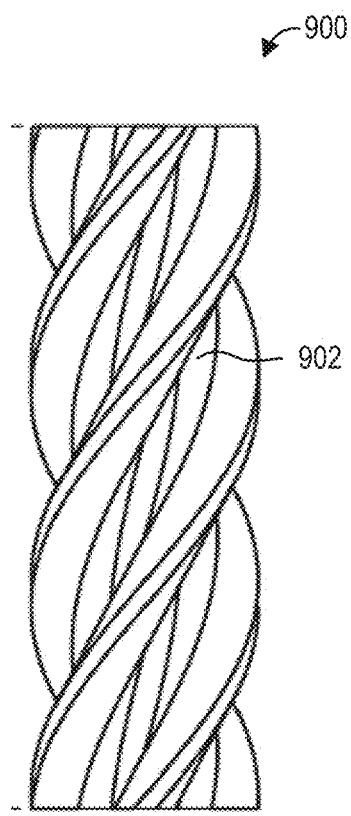
FIG. 9 illustrates one or more views of a lead screw, according to one exemplary embodiment.

FIG. 9 illustrates one or more views of lead screw 900, according to one exemplary embodiment. Lead screw 900 may be used as lead screw in generator apparatus 300 and generator apparatus 700. Lead screw 900 may include one or more grooves 902 formed therein. In some embodiments, lead screw 900 may be generated via three-dimensional printing. In some embodiments, lead screw 900 may be generated using a computer numerical control (CNC) system. In some embodiments, lead screw 900 may be generated using a casting process.

Figure 10:
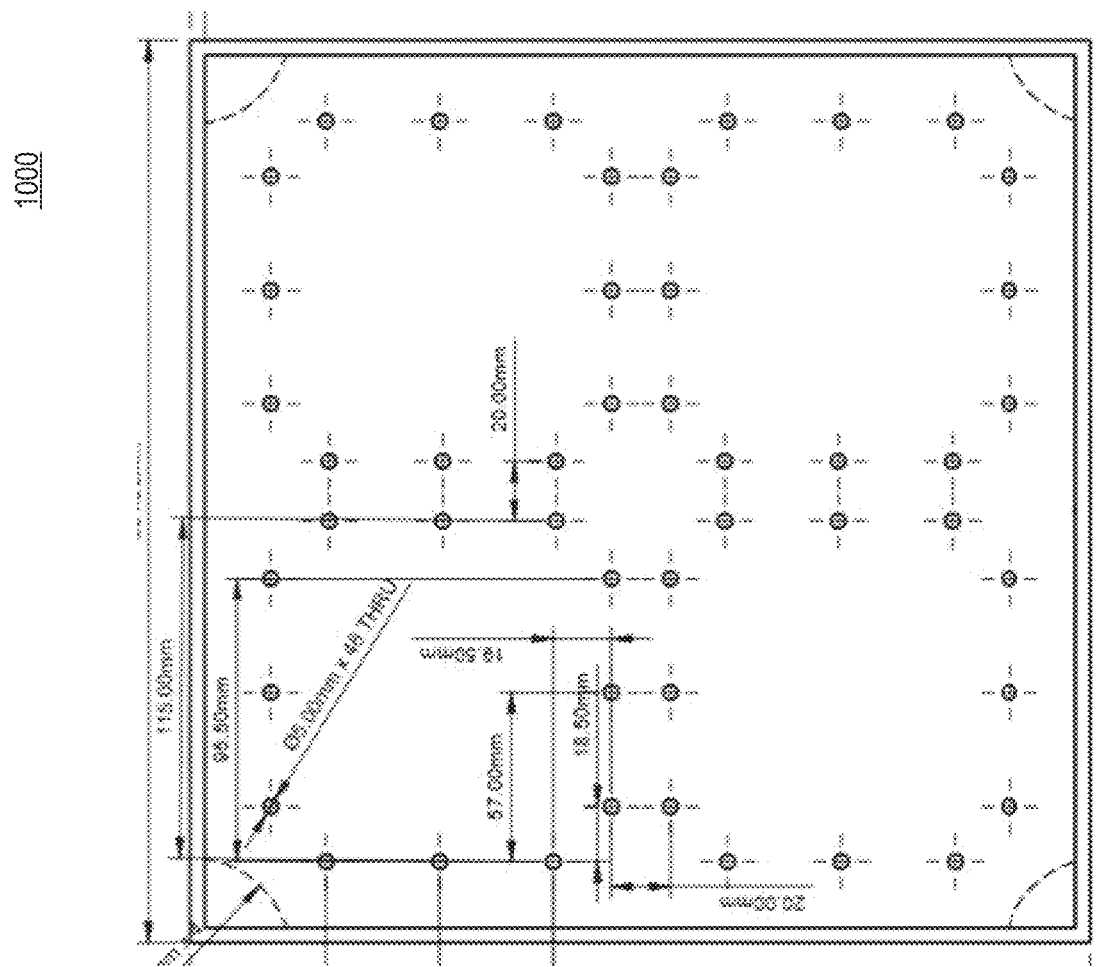
FIG. 10 is a top view of a floor device, according to one exemplary embodiment.

Referring back to FIG. 1, power generation system 100 may further include a floor device (not shown). FIG. 10 is a top view of a floor device 1000, according to one exemplary embodiment. Floor device 1000 may be enclosed in rubber and installed at the base of the each generator apparatus 104 and each tile 102. As such, floor device 1000 may allow installers to simply position the floor device 1000 and connect tiles 102 and generator apparatus 104, similar to plugging a cord into a wall outlet.

In some embodiments, floor device 1000 may be made of rubber or metal. Generally, floor device 1000 may be formed of any material that provides a water tight or NEMA 4X enclosure to ensure the electronics inside do not short due to water or dust getting into the circuits. Floor device 1000 may be used as an interconnect process to easily install tens of thousands of energy harvesting systems rapidly while also enabling the device to be easily replaced and altered on an as needed basis.

In some embodiments, floor device 1000 may allow individuals to run communications and Ethernet based communications for Internet-of-Things (IoT) purposes, which enables the monitoring of each individual device cheaper, easier and faster with lower latency. Having the capability to quickly deploy energy systems at scale drives price down, maintenance down, and enables systems, such as power generation system 100, to increase power capacity on large properties.

Referring back to FIG. 1, power generation system 100 may further include an energy reserve 152 and a controller 154. Energy reserve 152 may be configured to store energy (or power) harvested by each tile 102 and each generator apparatus 104. Controller 154 may be coupled to one or more components of power generation system 100. In some embodiments, controller 154 may be coupled to floor device 1000. In some embodiments, controller 154 may be coupled to each tile 102 or each generator apparatus 104. Controller 154 may be representative of a computing device (e.g., processor, memory, storage, I/O devices, etc.) configured to operate one or more controls of power generation system 100.

Figure 11:
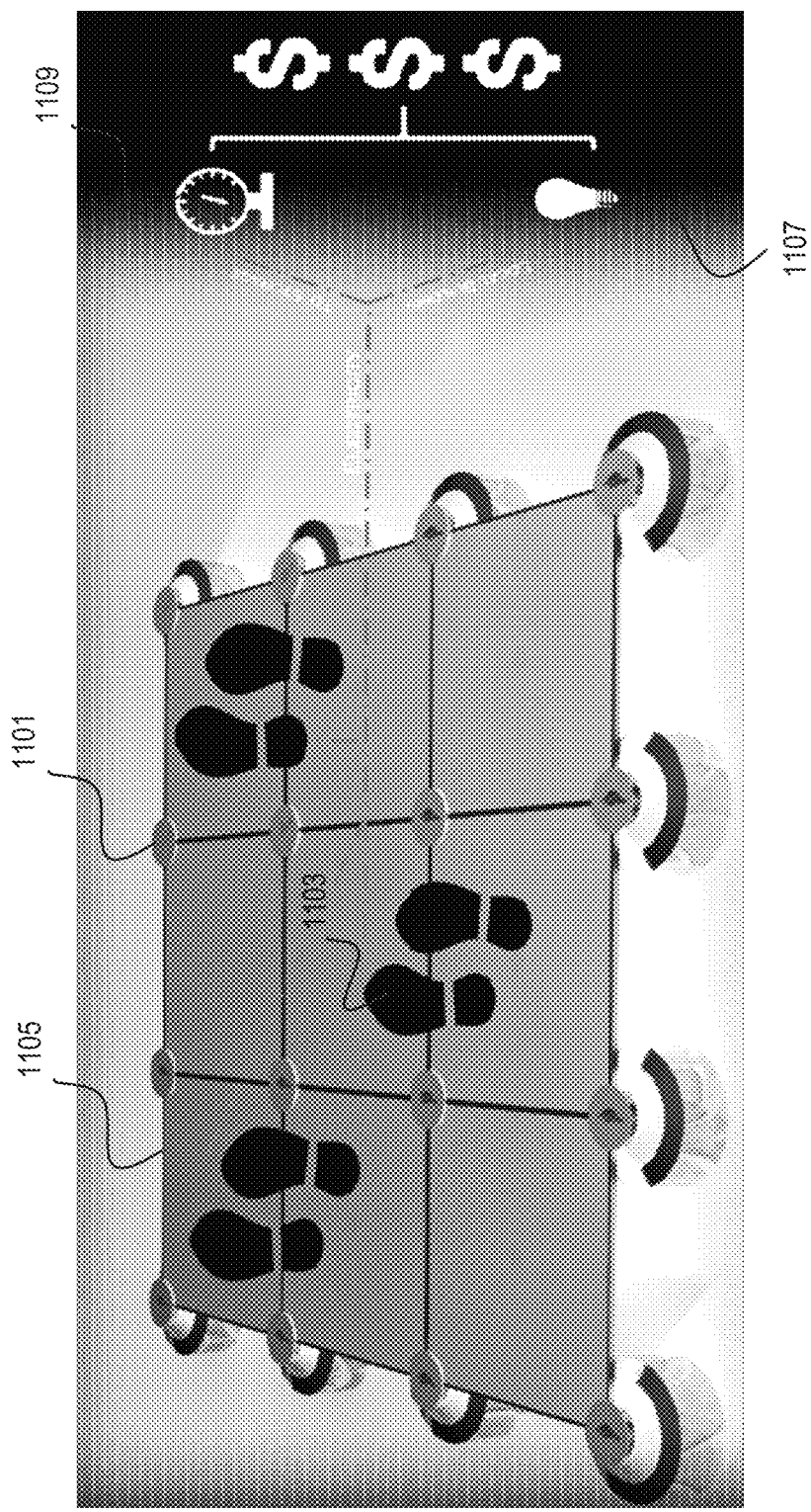
FIG. 11 is a system diagram for a power generation system, according to one exemplary embodiment.

FIG. 11 is a system diagram for a power generation system 1100, according to an exemplary embodiment. The illustrated system may generate power from a solar cells disposed in a tile 1101 and steps 1103 (on the array 1105) using a super-capacitor located within each unit of the depicted array 1105. The super-capacitor may then discharge the power to a local building 1107 or to a power grid 1109. Data recorded at the array related to the solar cell performance and power generation based on steps may be transmitted wirelessly to a data metrics component 1111 of the power generation system.

As illustrated the power generation system may include one or more slate tiles 1101. In the illustrated embodiment, there is a mini solar cell having dimensions a 4-inch width and 4-inch length (hereafter, 4"×4" solar cell) on each tile 1101 which generates power to run internal sensor electronics. The illustrated 4"×4" solar cell on each 4-unit connection may generate 1-5 Watts, which is may be separately routed to a storage system.

If a larger solar cell is used, more power may be generated by the power generation system. However, in one embodiment if the solar cell is larger than a 4"×4" solar cell, it may be placed as a strip around the tile or array. In such an embodiment, the outer perimeter of the entire unit may include one or more solar strips. Subsequently, when a person steps on any of the units the maximum potential power should be generated. In one embodiment of a power generation system an array may include 1 solar cell per 10 square feet and have the solar cells installed on the perimeter of the array.

In one embodiment, the power generation system may utilize a helical screw design that is configured to engage with a flywheel clutch mechanism, similar to generator apparatus 700. Power may then be generated using a radial flux generator In some embodiments, power may be generated using an axial flux generator. In some embodiments, power may be generated using a triboelectric generator. In some embodiments, the power generation system may generate between about 0.1 Watts to about 150 Watts per square foot. In some embodiments, the power generation system may generate more than 150 Watts per square foot. This power along with the solar cell contribution may reach a minimum power output of 10 Watts per square foot. In one embodiment, the power generation system may include 4 generators within a square foot. Power generation system 1100 may be configured to withstand heavy foot traffic and exceeding thousands of pounds. Power generation system 1100 may include one or more sensors configured to measure output of each device within the array and the total power put into the battery unit or directly to the power grid. In one embodiment, data and information from the sensors may be used for billing.

In one embodiment, power generation system 1100 may include separate energy harvesting systems for solar energy and any repetitive, compressive force in order to collect power and store the collected power in an onsite battery system. The primary power generation may be dependent on slate like solar cells (e.g., tile 1101). Each compressive force may generate an additional 10 Watts of power independently of the solar cell. Power generated from the compressive force and solar energy may be used to charge an external battery. Data collected from sensors located at or near the energy harvesting systems may be used for billing purposes and to track one or more quantitative metrics associated with power generation.

In one embodiment, the array may be installed at a client's location. Solar cells with a slate look or full transparent cells may be installed around the perimeter or in the vicinity of this array. The solar cells on the perimeter of the array may be configured to continuously charge the super capacitors contained within each unit of the array. For each compressive force on the array, 10 Watts of power may be generated. For example, when a person steps on the array, the power generated also helps in charging the super capacitor and signaling the super capacitor to output 10 Watts for a minute. The output from the super capacitor may be routed to a storage mechanism that passes the power through an inverter into a battery, building panel or electric grid. In one embodiment, the solar cells may be required to either be charging the units within the array or when all the super capacitors are charged so that power may flow directly into the storage system.

Figure 12:
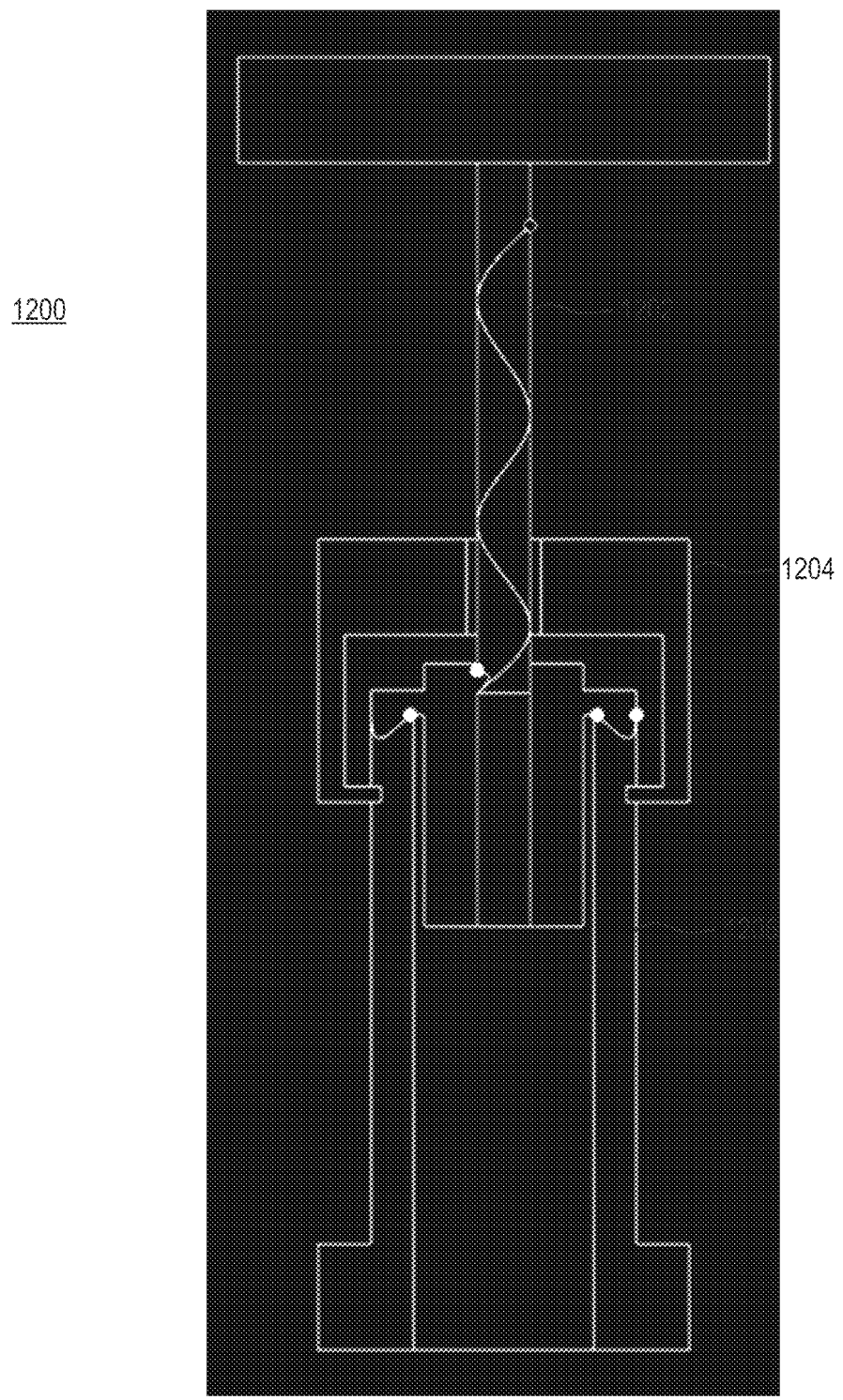
FIG. 12 is a diagram for a mechanical component of a power generation system, according to one exemplary embodiment.
Figure 13:
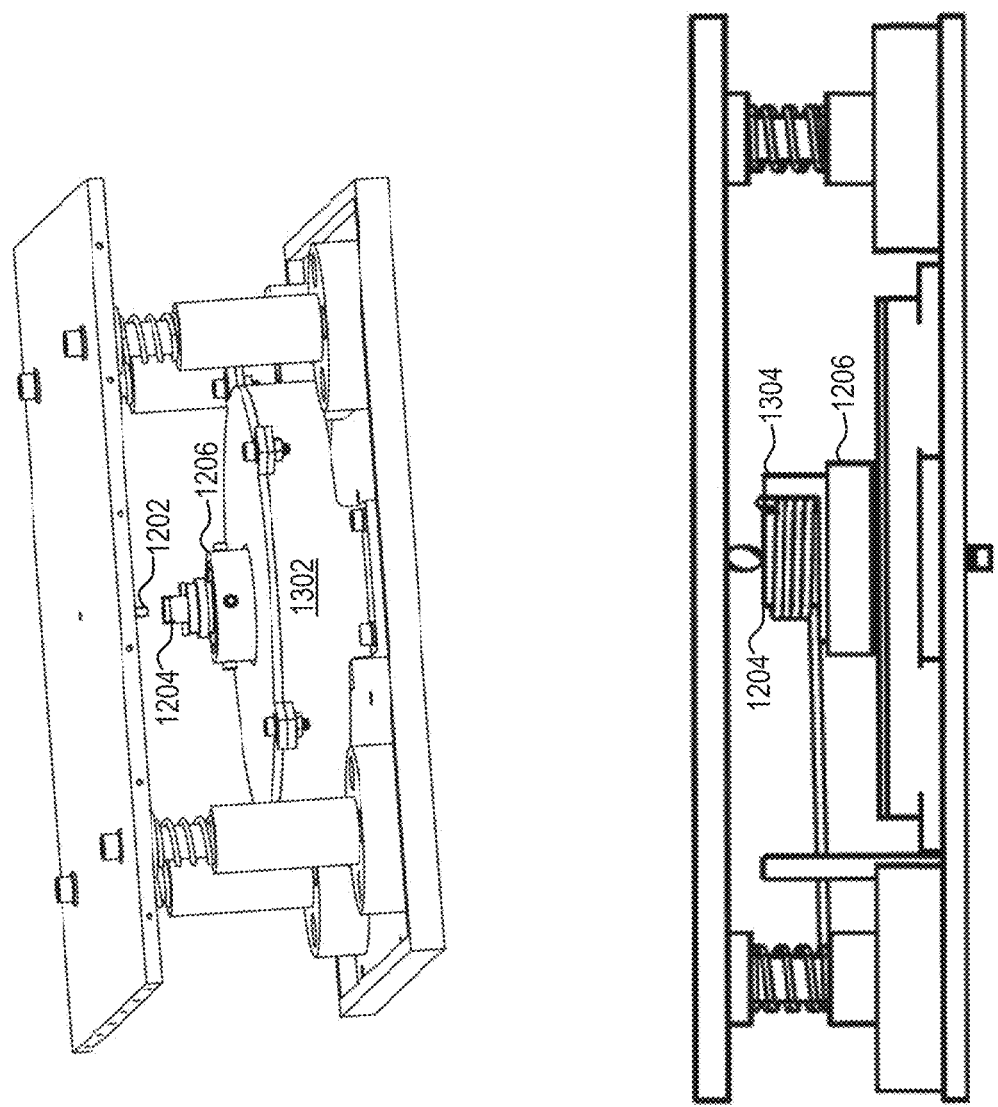
FIG. 13 is a diagram for a mechanical component of a power generation system, according to one exemplary embodiment.

In one embodiment, the power generation system may include multiple mechanical components 1200 including, for example, a helical screw 1202, clutch 1204, and flywheel 1206. FIGS. 12 and 13 are diagrams for mechanical components of a power generation system (e.g., power generation system 1100), according to an aspect of this disclosure. The power generation system may convert linear to rotational motion by the way of having a threaded rod drive through a mating clutch which connects to an object requiring to be rotated on the same plane as the force is applied.

In one embodiment, power generation system 1100 may utilize a radial flux generator, such as generator apparatus 700 discussed above in conjunction with FIG. 7. In this embodiment, a top plate of housing 1302 may be fixed to a threaded rod that is configured to be driven through a mating clutch mechanism located on the second plate of the housing 1302. In one embodiment, the threaded rod may be a deep pitch angle threaded rod. In one embodiment, the mechanical components may be configured to generate a high rotation per minute (RPM) spin. In one embodiment, a lubricant may be used to minimize the frictional coefficient of the rod and clutch mechanism. In one embodiment, helix screw 1202 to be designed for optimal durability and to achieve the necessary rotations per minute (RPM) within the flywheel mechanism to generate maximum power output for the longest duration possible. In one embodiment, a torsion spring 1304 may be positioned about helix screw 1202.

In one embodiment the clutch mechanism may be configured to match the threads of the helical screw and material selection will play a role in the ease of causing the rotation within the unit. A one-way clutch mechanism may be used so as to allow, for example, for a person to continuously run upon the device so that the energy from each step can contribute to the output of the system.

In one embodiment, power generation system 1101 may include a flywheel component and bearing mechanism used to reduce frictional losses. The flywheel component and bearing mechanism may impact the longevity of the power output from each compressive force. In one embodiment a micro-flywheel having a low starting torque may be used. This may be done to offset the loss of power generated from a compressive force due to the energy required to start the rotation of the system.

In one embodiment, the power generation system may include one or more electrical components including, for example, an axial flux generator, a sensor system, a storage mechanism, and a grid tie inverter.

In another embodiment, power generation system 1100 may utilize an axial flux generator, such as generator apparatus 300 discussed above in conjunction with FIG. 3. Axial flux generator may be connected directly to a flywheel component in order to generate power from the mechanical motion. The axial flux generator and flywheel component may be configured to provide a low frictional system that provides power at a lower RPM and uses a low magnetic resistance so that a higher energy efficiency may be gained.

Figure 14:
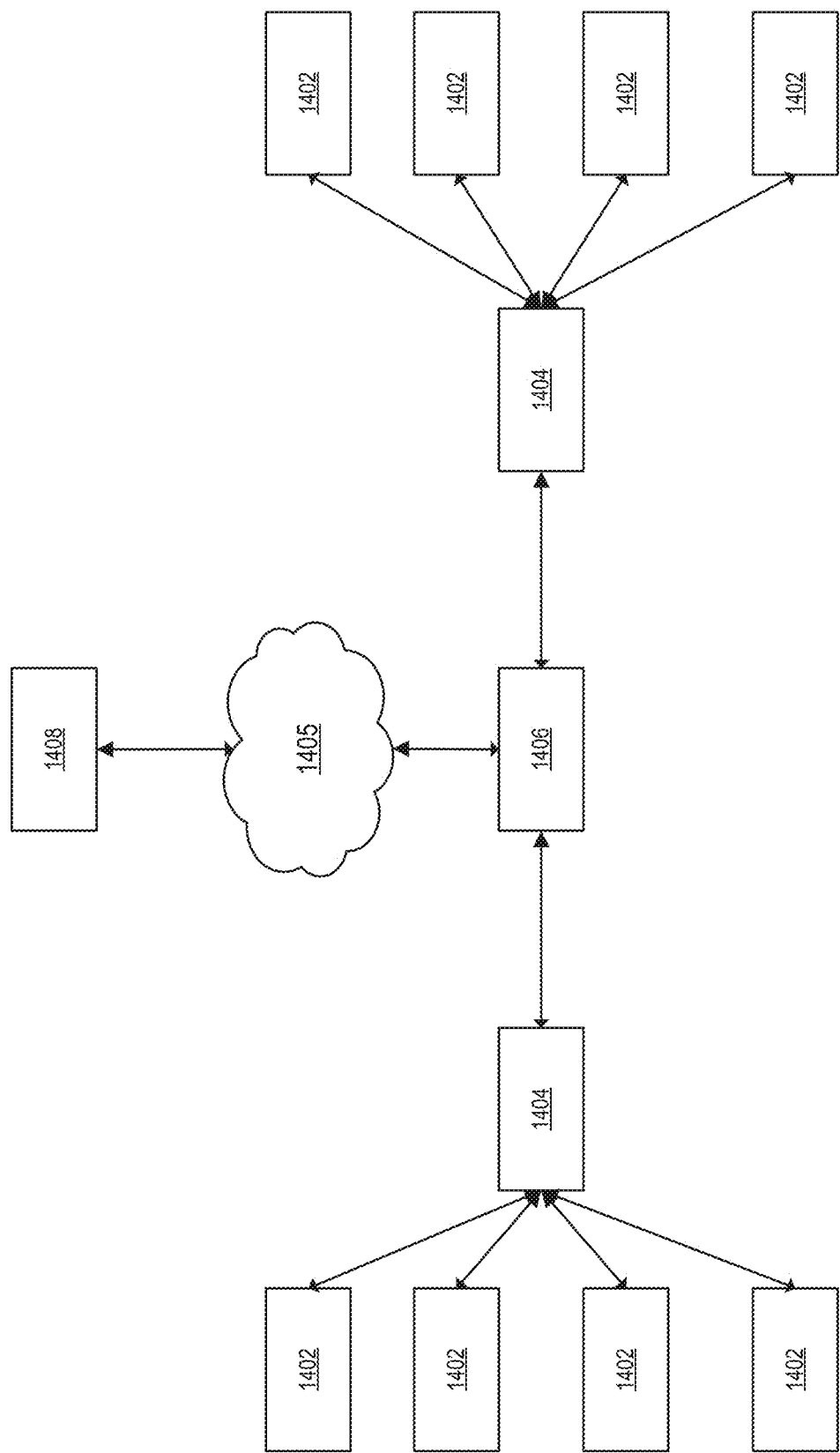
FIG. 14 is a network diagram for a power generation system, according to one exemplary embodiment.

FIG. 14 illustrates a computing environment (e.g., sensor system 1400), according to one exemplary embodiment. In one embodiment, the power generator system may include a sensor system 1400. The sensor system 1400 may be configured to monitor each unit's power generation. The sensor system 1400 may include one or more sensors 1402, one or more hubs 1404, and one or more relays 1406, communicating via network 1405. Each sensor may monitor one or more of the following: Voltage, Current, Humidity, Force/Steps, Temperature, Resistance and Weight. The sensors 1402 may be battery powered so that they do not require drawing power from the electric grid or power generator system. Additionally the sensors 1402 may receive software updates and provide information to other components via wireless or wired communication protocols. In one embodiment the sensors may communicate with mobile devices or computers using an application, Bluetooth, or Near Field Communication. As illustrated in FIG. 14, the sensors 1402 may be coupled to a controller (hub) 1404 which may then be coupled to a relay 1406. In one embodiment, the hub 1404 may be wired for an array having 10,000 units. The hub 1404 may also include a data storage buffer that may record and store data corresponding to 7 days of activity. The relay 1406 may communicate via Ethernet with Wi-Fi/LTE used as a backup. The relay 1406 may transmit data and confirm data transfer to a data repository 1408 via network 1405. In one embodiment, the data repository 1408 may be located within a cloud server. The relay 1406 may connect via SSL/TLS. In one embodiment, the sensors 1402 may track where and how people may walk across the array.

In one embodiment, power generator system 1100 may include a storage mechanism such as a battery that may be used for commercial building locations as well as residential areas. The storage mechanism may be mountable on the side of a building, easily serviceable, and allow for adding extra storage by connecting multiple units together.

In one embodiment, power generator system 1100 may include a grid tie inverter that is designed to take power from the storage mechanism and then send power back into the electric grid. The grid tie inverter may be designed to have the capability to be adjusted to match requirements of electric grids in other countries.

In one embodiment, power generator system 1100 may include one or more dashboards. A client dashboard may be used to provide the customer the ability to view metrics of the array, request service, payments, and receive information regarding the power generation. The client dashboard may include a billing portal that provides access to current bill and past bills, a tracker for power generated and used, and a bill breakdown showing the power used for building and sold to grid. The client dashboard may also include an array tracker that shows the visual image of the arrays installed embedded into clients building architecture plans, allows for client to click and see per unit metrics, each unit clicked should allow for client to see all data insights on that unit, and show any units that may need servicing. The client dashboard may also include a monthly tracker that shows the power generation metrics on a daily, monthly and yearly basis. The client dashboard may also include traffic metrics that display how many people walked across array and when, and an hourly breakdown of traffic.

In one embodiment, power generator system 1100 may include an administrator dashboard configured to provide an administrator with data and metrics collected on the array. The administrator dashboard may include billing override capabilities, administrative features to manually edit any of customer features, and access to data metrics on people walking across arrays.

In one embodiment power generator system 1100 may include one or more mobile applications. A client mobile application may allow users to access to a dashboard via an application as well as track individual traffic metrics available on the public application.

A public application may allow people who interact with the arrays to view information about the array. This may include a step tracker that tracks how people walk across an array and gives metrics on power generated and direction traveled, and an impact forum that displays s the impact and metrics for different install sites for people to keep track of, a newsletter. In one embodiment, the public application may be a part of a fundraiser or other social activity. For example, every step on the array may correspond to a donation amount.

In one embodiment, power generator system 1100 may include high efficiency solar cells. The solar cells may configured to generate 10-15 Watts of power per square foot tile or more by harvesting the light available in the installation facility. In one embodiment a slate looking solar cell may be used as it may be disguised into the flooring at the installation site with tile or hardwood. In one embodiment the solar cells may use copper, indium, and/or selenium as these elements have been shown to have higher efficiency and power outputs. The solar cell can either feed a continuous power flow to the external storage mechanism through the units or by charging mini super-capacitors on each unit and then following a step each unit discharges 10 Watts to the battery for 1 minute. Any configuration of solar cells that results in the efficient harvesting of energy may be used. In one embodiment transparent solar cells may be used. Transparent solar cells may harvest energy from different spectrums of light including those not visible, however may be less efficient than conventional solar cells, thus requiring a larger footprint of solar cell use.

In one embodiment power generator system 1100 may include an internal super capacitor. The generator and solar cells may charge an internal super capacitor which may be configured to store and release up to 15 Watts of power on a continuous basis for up to 24 hours. Graphene based super capacitors may be used. In one embodiment, the super capacitor dimensions may be limited to a square foot and ½ inch thick. The super capacitor may be waterproof and dust tight with a mean time before failure (MTBF) of 20 years. The super capacitor may also be configured to take variable voltage and current from different sources. Should the super-capacitors discharge with no charge input incoming, the system should include a charge control mechanism which will not release power until the super-capacitor has recharged to a stable level.

Power generator system 1100 may include a housing such that the power generator system is modular. A top plate of the housing may include solar cells, and flooring. The top plate of the housing may be removable from the remaining portions of the power generator system. Accordingly, the flooring may not need to be thrown out each time the power generation components of the system are accessed. The housing may contain a generator housing holding the generator, flywheel, helix screw and/or sensors. The generator housing may be configured to be easily removed and replaced. The housing may be sealed so that the unit does not allow for debris and water to easily enter and damage the generator housings. Furthermore, the housing may be designed such that water cannot collect under the flooring. The housing may also be designed such that the top is sealed yet has a porous foundation that allows for water to drain in the event of a spill.

In one embodiment power generator system 1100 may include modular components that may be easily installed and connected together via a snap or slide in lock. Furthermore the power generator system may be designed such that the unit must account for the off chance of having to remove the full unit rather than just the top plate. Furthermore, the electrical connections between the units may be configured so that the units may be connected together so that there is one output which heads to the building battery cell and the grid tie inverter.

In one embodiment, the power generator system may use a pulse motor and starter. A pulse motor may use a solenoid or several solenoids matched with strong neodymium magnets to create a truly brushless motor. By passing intermittent pulses of current through the solenoid, the flywheel/motor component will be able to pick up speed and sustain for the duration that the motor runs. This mechanism may be designed to run on very little current and high voltage. This mechanism can be incorporated to generate more power from a single compressive force by utilizing a large capacity battery and motor tuned to last years, or mini solar cells to continuously charge the pulse motor battery unit. Furthermore, this unit generates a back electromagnetic field EMF which can also be used to increase the efficiency of the pulse motor. This pulse motor would allow for a single unit to generate the 10 Watts for up to a minute due to the added energy from pulse motor during the compressive force event. The pulse motor may be used to improve the efficiency of energy harvesting as multiple sources of energy can be aggregated into one single output.

In one embodiment, piezoelectric plates may be used to run the pulse motors so as to eliminate the need for solar cells. In one embodiment, a unit's top plate may be composed of piezoelectric (PZT) material. Accordingly, whenever a compressive force event takes place, the piezoelectric crystals would be able to generate power to charge the high-capacity battery to drive the pulse motor. Using piezoelectric material allows a user to cover the floor in the material of their choice. Additionally, the piezoelectric crystals, can increase the power output by increasing the surface density due to nano-etching pyramidal structures onto the substrate. However, the piezoelectric material may require that instantaneous output from a compressive force be put through a bridge rectifier, and capacitor circuit to smooth the power out into the battery cell. Another kind of piezoelectric that can be used is poled barium titanate. The higher output characteristics could help alleviate the need for a large footprint of solar cells needed.

In one embodiment, the power generator system may include thermoelectric generators that are configured to harvest the lost heat energy on the floor during the compressive force events. Due to the constant moving parts within the mechanism, heat is generated. When done so the thermoelectric generator is able to create a closed loop to help improve the efficiency of the device.

Figure 15:
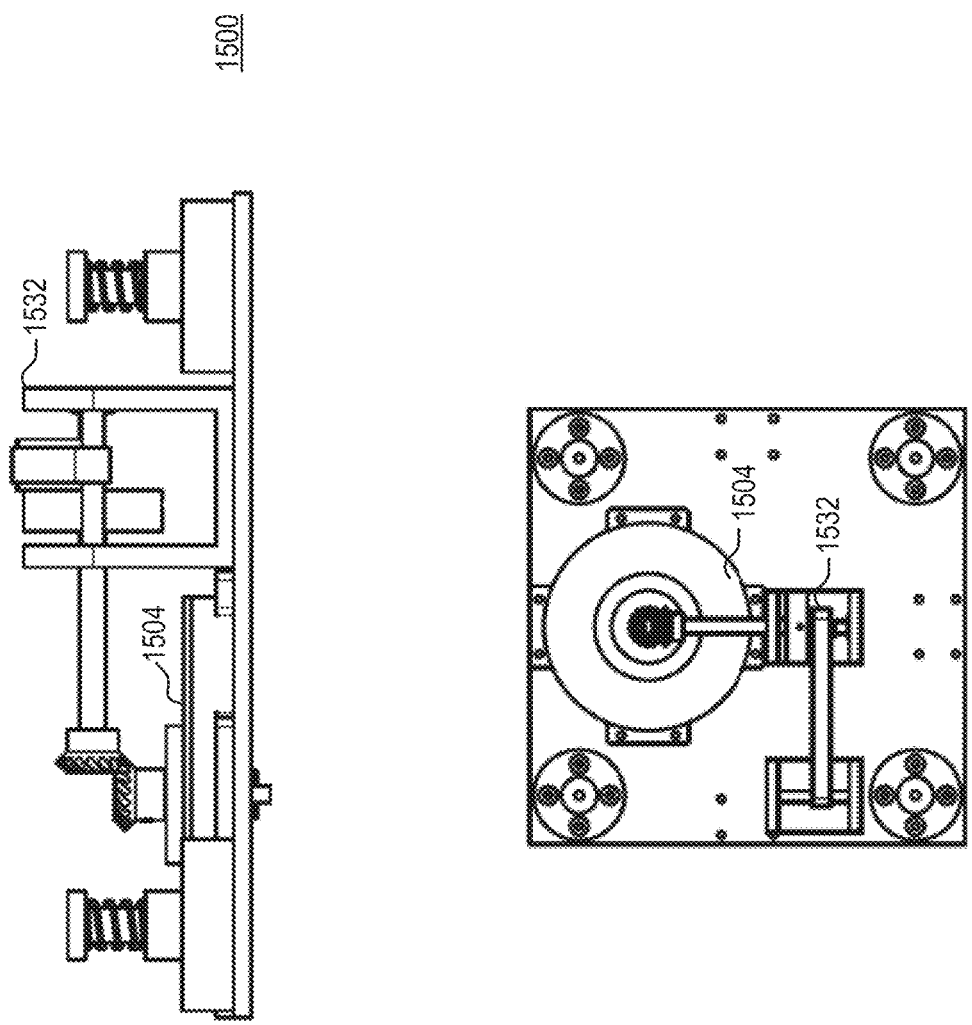
FIG. 15 is a diagram for lever systems used with a power generation system, according to one exemplary embodiment.

As illustrated in FIG. 15, lever systems 1500 may be used with a power generation system. The top panel in FIG. 15 illustrates a lever 1502 configured to drive the system like a rack and pinion gear system. The bottom left panel in FIG. 15 illustrates a lever 1522 configured to carry momentum created to spin the system. The bottom right panel in FIG. 15 illustrates a lever 1532 configured to use a similar rotational design but locks the system after each event to allow a flywheel 1504 to carry the momentum. In one embodiment a lever may be used on the side, such that within each unit a rotation for an axial flux generator may be generated by placing a free rotating lever connected to a 90 degree screw converter which will then all for an axial flux generator or triboelectric generator to be spun.

Figure 16:
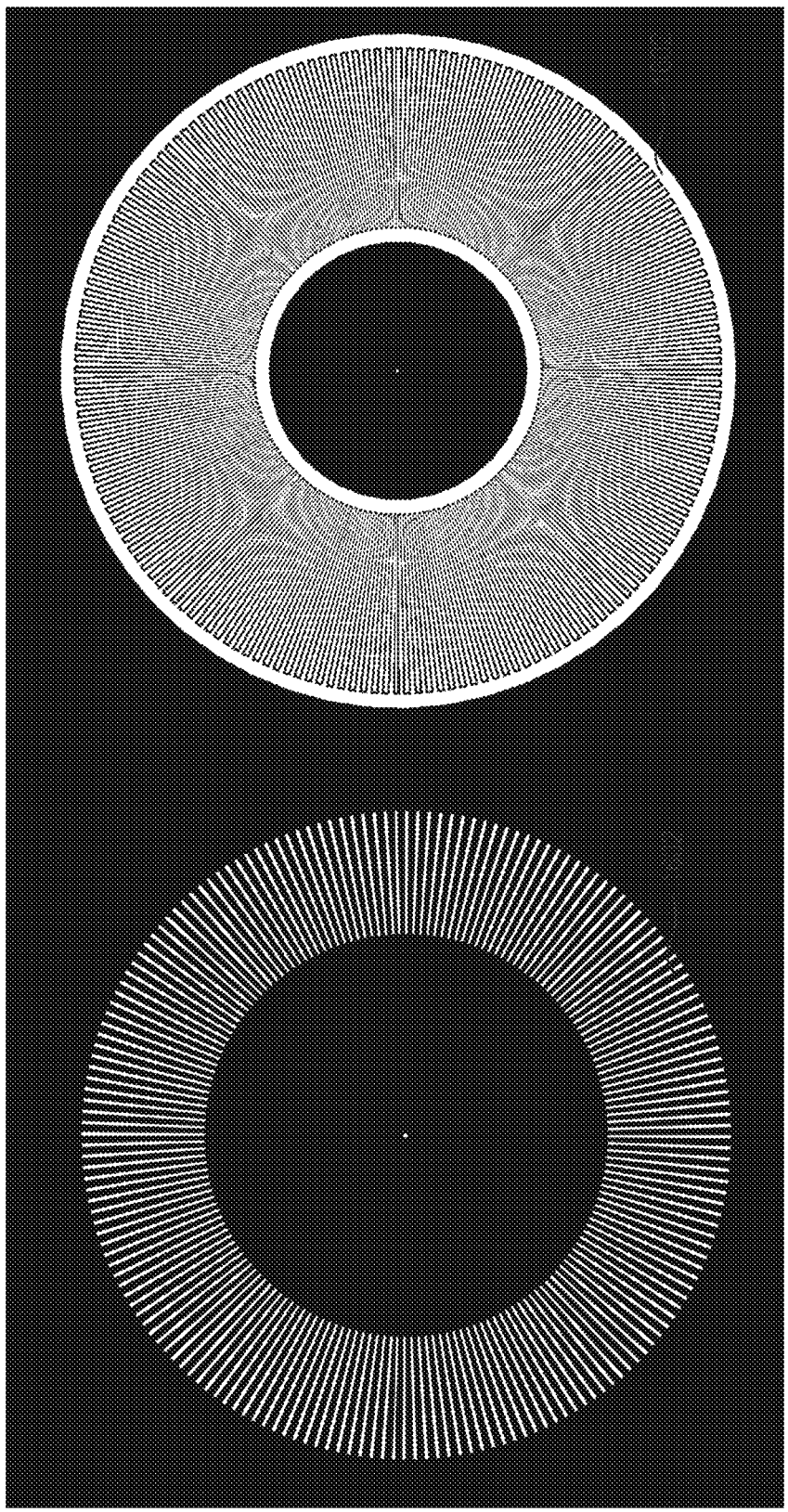
FIG. 16 is a diagram for a triboelectric system used with a power generation system, according to one exemplary embodiment.

As illustrated in FIG. 16 in one embodiment, the power generator system may include a triboelectric generator. Illustrated are a rotor 1602 and a stator 1604. This triboelectric system can operate as a noncontact power generation system when rotated. The system may include conductive metal gratings like copper placed onto an FR4 PCB board or a Teflon based PCB board. The stator 1604 must then be treated with a thin layer of dielectric triboelectric material. The material could be kapton or Teflon or any suitable material as long as the material is a charge acceptor. When the rotor 1602 is spun at a distance between 0 and 10 cm power may be generated.

A newly discovered design and fabrication process for a triboelectric generator is utilizing a system which is a non-contact or contact based rotating disk triboelectric generator. The triboelectric generator may be used as a replacement to or an addition to an axial flux generator to achieve power outputs higher than 10 Watts due to the material advantage. The triboelectric generator may transfer static charge from electrode to electrode to create an AC power output via the gratings. The gratings can be of any conductive material and any dielectric and triboelectric material may be used as the charged material. During rotation of anywhere between 1 to 5000 rpm power output can be enhanced to optimally pull charge from the system. This device can work in a vacuum as well as in open air conditions. The tested unit used kapton and copper deposited onto a printed circuit board (PCB) to generate power.

In one embodiment, the power generator system may include a rack and pinion based mechanism where each unit has axial flux generators laid on the z axis aligned with the downward direction the rack gear is pointed. In one embodiment, whenever a person steps on the rack, the gear may spin multiple stacks of axial flux generators or triboelectric generators aligned in tubes.

In one embodiment, the power generator system may be turbine based. For example, a tetrapack based pump may be used within the unit aligned with a lightweight flywheel, a 'frictionless' conversion system can be utilized to spin the axial flux generator or triboelectric generator laid on the x axis or like the tubes in the rack and pinion based system. In this case when someone steps on the unit a burst or air is pushed out to spin the generators to then output power.

Figure 17:
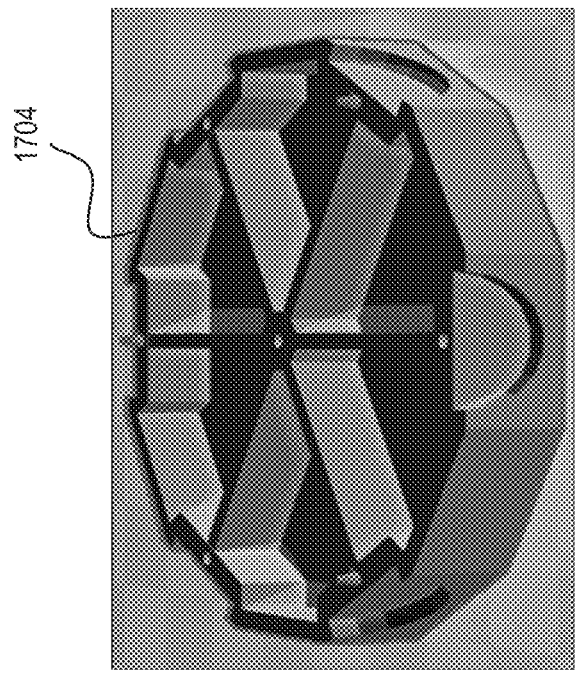
FIG. 17 is a diagram for a flywheel system used with a power generation system, according to one exemplary embodiment.
Figure 17:
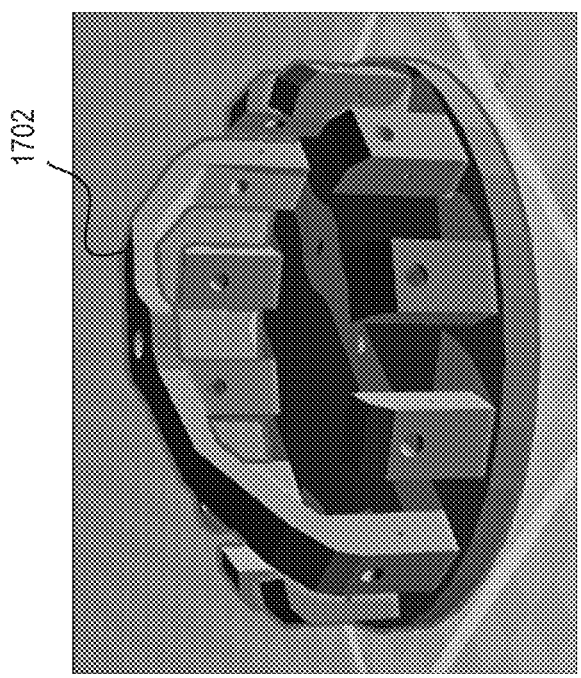

FIG. 17 is a diagram for a flywheel system 1700 used with a power generation system, according to an aspect of this disclosure. In particular, illustrated in FIG. 17 is a pulse motor housing 1702 illustrating how the flywheel 1704 sits within the pulse motor system. How this system works is that when we drive in electricity from ambient sources of power we create an alternating charge within the induction coils. This creates a magnetic field which when the magnets come into it pushes them away while also pulling at the same time from the neighboring induction coil with the alternate charge. Using this system is a highly efficient way to create a brushless DC motor that acts as a starter system.

In one embodiment, the power generation system may utilize one or more of a helix screw, lever system, rack and pinion or turbine. The power generation system may also utilize one or more of an axial flux generator, a triboelectric generator, and a piezo electric generator. The power generation system may also include one or more supporting power generation units such as a solar cell, piezoelectric generator and/or a thermoelectric generator. The power generation system may include a mechanical energy storage component such as a flywheel or a flywheel having a pulse motor. The power generation system may be contained within a housing having any suitable shape including, but not limited to, one or more triangular or square boxes. In one embodiment, the power generation system may be communicatively coupled to a network with Internet access. The components of the power generation system that are communicatively coupled to the network may be at least one of solar, battery, triboelectric, thermoelectric, piezoelectric, or axial flux generator powered. In one embodiment, the power generation system may include an external storage capacity having a supercapacitor, battery. In one embodiment power may flow directly to the external storage.

Although the disclosure above has been described in terms of exemplary embodiments, it is not limited thereto. Rather, the appended claims should be construed broadly to include other variants and embodiments of the disclosure, and combinations thereof, which may be made by those skilled in the art without departing from the scope and range of equivalents of the embodiments disclosed and claimed herein. This disclosure is intended to cover any adaptations or variations of the embodiments discussed herein.

The invention claimed is:

1. An apparatus, comprising:
   two or more tiles, each tile configured to house one or more solar cells, each of the two or more tiles comprising a mechanism configured to protect the one or more solar cells from downward force; and
   at least one generator apparatus coupling each of the two or more tiles together at a vertex of each tile, the at least one generator apparatus configured to harvest mechanical energy as mass traverse over each tile of the two or more tiles.

2. The apparatus of claim 1, further comprising:
   a second generator apparatus, wherein the second generator apparatus couples each of the two or more tiles together at a second vertex of each tile.

3. The apparatus of claim 1, further comprising:
   a third tile; and
   a second generator apparatus coupling the third tile to at least one tile of the two or more tiles at a second vertex of the at least one tile of the two or more tiles.

4. The apparatus of claim 1, wherein the generator apparatus is an axial flux generator.

5. The apparatus of claim 4, wherein the generator apparatus comprises:
   a connector configured to support at least one tile of the two or more tiles;
   at least one rotor housing an array of magnets;
   a lead screw coupling the connector to the at least one rotor; and
   a biasing mechanism at least partially surrounding the lead screw, the lead screw and biasing mechanism configurable between a relaxed state and a compressed state.

6. The apparatus of claim 5, wherein, in the compressed state, lead screw causes the at least one rotor to rotate.

7. The apparatus of claim 6, wherein the generator apparatus, comprises:
   a clutch mechanism, wherein the lead screw is coupled to the clutch mechanism, the clutch mechanism configured to sustain rotation of the at least one rotor when the biasing mechanism and the lead screw return to the relaxed state.

8. The apparatus of claim 1, wherein the generator is a radial flux generator
   a connector configured to support at least one tile of the two or more tiles;
   a gear array, comprising a central gear and one or more periphery gears;
   a lead screw coupling the connector to the central gear; and
   a biasing mechanism at least partially surrounding the lead screw, the lead screw and biasing mechanism configurable between a relaxed state and a compressed state.

9. The apparatus of claim 8, wherein, in the compressed state, lead screw causes the central gear to rotate, which rotates the one or more periphery gears.

10. The apparatus of claim 1, where in the mechanism, comprises:
    a bottom plate; and
    a protective top plate, wherein the one or more solar cells are disposed between the bottom plate and the top plate.

11. The apparatus of claim 10, wherein the protective top plate is formed from a transparent or translucent material.

12. An apparatus, comprising:
    a tile having three or more vertices, the tile comprising one or more solar cells configured to harvest solar, the tile comprising a mechanism configured to protect the one or more solar cells from downward force; and
    three or more generator apparatuses, each generator apparatus positioned at a vertex of the tile, each generator apparatus configured to harvest mechanical energy as mass traverse the tile.

13. The apparatus of claim 12, wherein at least one generator apparatus is an axial flux generator.

14. The apparatus of claim 13, wherein the at least one generator apparatus comprises:
    a connector configured to support at least one tile of the two or more tiles;

at least one rotor housing an array of magnets;

a lead screw coupling the connector to the at least one rotor; and a biasing mechanism at least partially surrounding the lead screw, the lead screw and biasing mechanism configurable between a relaxed state and a compressed state.

15. The apparatus of claim 14, wherein, in the compressed state, the lead screw rotates the at least one rotor.

16. The apparatus of claim 15, wherein the at least one generator apparatus, comprises:

a clutch mechanism, wherein the lead screw is coupled to the clutch mechanism, the clutch mechanism configured to sustain rotation of the at least one rotor when the biasing mechanism and the lead screw return to the relaxed state.

17. The apparatus of claim 12, wherein at least one generator apparatus is a radial flux generator a connector configured to support at least one tile of the two or more tiles;

a gear array, comprising a central gear and one or more periphery gears;

a lead screw coupling the connector to the central gear; and a biasing mechanism at least partially surrounding the lead screw, the lead screw and biasing mechanism configurable between a relaxed state and a compressed state.

18. The apparatus of claim 17, wherein, in the compressed state, the lead screw rotates the central gear, which rotates the one or more periphery gears.

19. The apparatus of claim 10, where in each of the two or more tiles, comprises:

a bottom plate; and a protective top plate, wherein the one or more solar cells are disposed between the bottom plate and the top plate.

20. A method of harvesting multiple sources of energy, comprising:

providing a power generation apparatus, the power generation apparatus comprising a tile having one or more solar cells included therein, the tile comprising a mechanism configured to protect the one or more solar cells from downward force, and a generator apparatus coupled to the tile;

harvesting solar energy by converting received light energy to electrical energy using the one or more solar cells;

harvesting mechanical energy via actuation of the generator apparatus from a relaxed state to a compressed state; and combining the solar energy and the mechanical energy into an energy reserve.

* * * * *